United States Patent [19]
Box

[11] 4,430,376
[45] Feb. 7, 1984

[54] GLASS-TO-METAL COMPRESSION SEALED LEAD-IN STRUCTURE

[76] Inventor: Leonard J. Box, 1325 Pleasant Valley Way, West Orange, N.J. 07052

[21] Appl. No.: 397,812

[22] Filed: Jul. 13, 1982

[51] Int. Cl.³ .......................... B32B 1/04; B32B 15/00
[52] U.S. Cl. ..................................... 428/174; 65/59.1; 65/59.4; 65/59.34; 403/179; 403/29; 403/30; 403/404; 428/432; 428/433; 428/76
[58] Field of Search ................ 428/76, 432, 433, 174; 65/59.1, 59.4, 59.34; 403/179, 29, 30, 404

[56] References Cited
U.S. PATENT DOCUMENTS

| | | | |
|---|---|---|---|
| 3,035,372 | 5/1962 | Mayers | 65/32 |
| 3,264,015 | 8/1966 | Mayers | 65/59.34 |
| 3,370,874 | 2/1968 | Scherer et al. | 65/59.34 |
| 3,371,413 | 3/1968 | Rundle | 65/59.34 |
| 4,029,897 | 6/1977 | Mayer | 428/433 |
| 4,128,697 | 12/1978 | Simpson | 428/432 |

OTHER PUBLICATIONS

*Metals Handbook 9th Edition*, vol. 4, Heat Treating "Gas Carburizing" p. 135 by ASM Committee 81.
Dictionary of Metallurgy by Merriman, 1958, p. 30.

*Primary Examiner*—Marion McCamish
*Assistant Examiner*—E. Rollins Buffalow
*Attorney, Agent, or Firm*—Michael Ebert

[57] ABSTRACT

A glass-to-metal compression sealed lead-in structure for electronic devices. The structure is constituted by an outer metal case having a high coefficient of thermal expansion (CTE), a lead-in conductor extending through the opening in the case and having a relatively low CTE, and a glass seal filling the space between the conductor and the case and having a relatively low or intermediate CTE. The conductor is fabricated of a machinable metal whose normal CTE is higher than required, the surface of the metal after the conductor is machined to specification, being treated with a substance that acts to reduce the CTE of the conductor to render it compatible with the CTE of the glass seal.

5 Claims, 2 Drawing Figures

GLASS-TO-METAL COMPRESSION SEALED LEAD-IN STRUCTURE

BACKGROUND OF INVENTION

This invention relates generally to sealed lead-in structures for electronic devices, and in particular to a glass-to-metal compression sealed lead-in structure, and to a novel technique for making such structures.

Sealed lead-in structures for electronic devices fall into two basic classes. In the first, called the "matched seal class," the lead-in conductor extends through the opening of an outer metal case, the annular space therebetween being filled with a glass seal. The metal of the case and that of the conductor have a like coefficient of thermal expansion (CTE). Typically, a matched seal structure makes use of a metal case and conductor, both composed of a low expansion cobalt-nickel-iron alloy and a glass seal of borosilicate glass having similar thermal expansion characteristics so that the unit is strain from (see Klebanoff et al. U.S. Pat. No. 2,826,630).

The present invention is concerned chiefly with the second class of lead-in sealed structures, commonly referred to as compression sealed. In this structure, seal integrity is imparted by compression stresses in the seal arising in the course of sealing (see Dalton U.S. Pat. No. 2,770,923). In order to achieve a compression seal, the outer case must have a high CTE, the lead-in conductor passing through the opening in the case must have a relatively low CTE and the glass seal must have a low or intermediate CTE.

Compression seal lead-in structures in which the outer case is composed of cold rolled steel and the inner conductor is formed of a nickel-iron alloy are widely used in the microelectronics industry to provide headers for transistors, integrated circuits and in various other applications.

Thus the Mayers U.S. Pat. No. 3,035,372 discloses a compression sealed glass-to-metal lead-in structure in which the case is SAE 1010 steel whose CTE is about $125 \times 10^{-7}/°C.$, the lead-in conductor is No. 52 nickel-iron alloy (about 51% nickel) whose average CTE is about $96-100 \times 100^{-7}/°C.$, and the seal is a glass composition whose average CTE is about $89 \times 10^{-7}/°C.$ It is also known, in lieu of alloy No. 52 for the lead-in conductor to use KOVAR (cobalt-nickel-iron) for this purpose.

The use of No. 52 alloy or KOVAR in a compression-sealed lead-in structure gives rise to certain problems. These alloys are not only relatively expensive but they are not readily available in all forms. Moreover, these alloys are very difficult to machine. Thus if the specification for a compression-type lead-in structure calls for a conductor of a non-standard gauge, or for threading or other details which entail machining, this requirement cannot be easily satisfied with existing alloys which are difficult to machine and it adds substantially to the cost of manufacturing the structure.

Another drawback in the use of No. 52 alloy, KOVAR or other iron and nickel containing alloys having ferromagnetic properties for the inner conductor of the lead-in structure is that when the structure is associated with an electronic component to which a high frequency current is applied through the conductor, then an electromagnetic field will be created that induces eddy currents in the conductor and generates heat that may be damaging to the seal or to the electronic circuit to which the conductor is connected.

The following additional patents are of background interest, for they deal with compression sealed glass-to-metal lead-in structures of various types: Earl—U.S. Pat. No. 3,545,950; Simpson—U.S. Pat. No. 4,128,697; Wildeboer—U.S. Pat. No. 3,356,466; Hodgdon et al.—U.S. Pat. No. 2,811,567; and Baas et al., U.S. Pat. No. 3,225,132.

SUMMARY OF INVENTION

In view of the foregoing, the main object of this invention is to provide a glass-to-metal compression sealed lead-in structure having a machinable metal conductor whereby the conductor may be readily machined or otherwise formed in specification and yet afford the desired coefficient of thermal expansion.

More particularly, an object of this invention is to produce a technique for producing a conductor of the above type which, after machining or forming, is treated to impart a CTE thereto appropriate to a compression type glass-to-metal seal.

Also an object of this invention is to provide a compression-sealed lead-in structure which, though less expensive to manufacture than a conventional structure, has more advantageous characteristics.

A salient feature of a structure in accordance with the invention is that the lead-in conductor may be of non-magnetic material and therefore not subject to eddy current losses.

Briefly stated, these objects are attained in a glass-in-metal compression sealed lead-in structure for electronic devices. The structure is constituted by an outer metal case having a high coefficient of thermal expansion (CTE), a lead-in conductor extending through the opening in the case and having a relatively low CTE and a glass seal filling the space between the conductor and the case and having a relatively low or intermediate CTE.

The conductor is fabricated of machinable metal such as stainless steel whose normal CTE is higher than required, the surface of the metal after the conductor is machined to specification, being treated as by carburizing with a substance that acts to reduce the CTE of the conductor to render it compatible with the CTE of the glass seal.

OUTLINE OF DRAWINGS

For a better understanding of the invention as well as other objects and further features thereof, reference is made to the following detailed description to be read in conjunction with the accompanying drawings, wherein:

FIG. 1 is a section taken through the glass-to-metal compression sealed lead-in structure in accordance with the invention; and FIG. 2 is a plan view of the structure.

DETAILED DESCRIPTION

Figure 1:
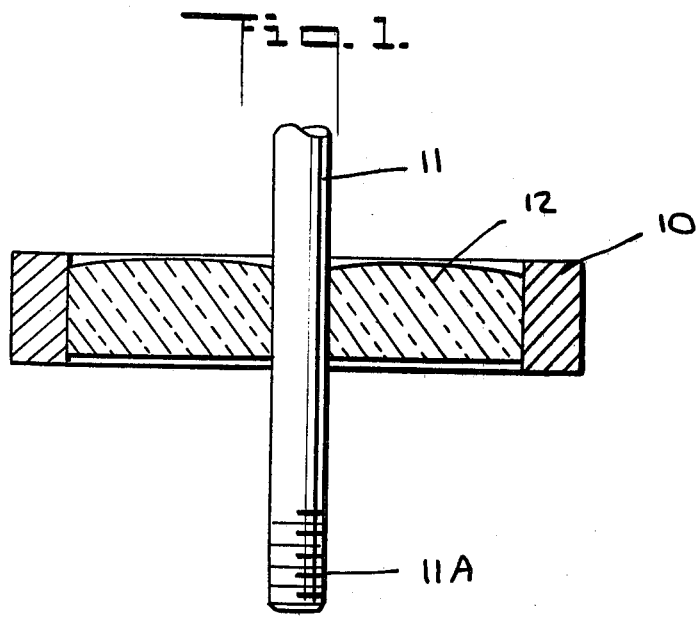
Figure 2:
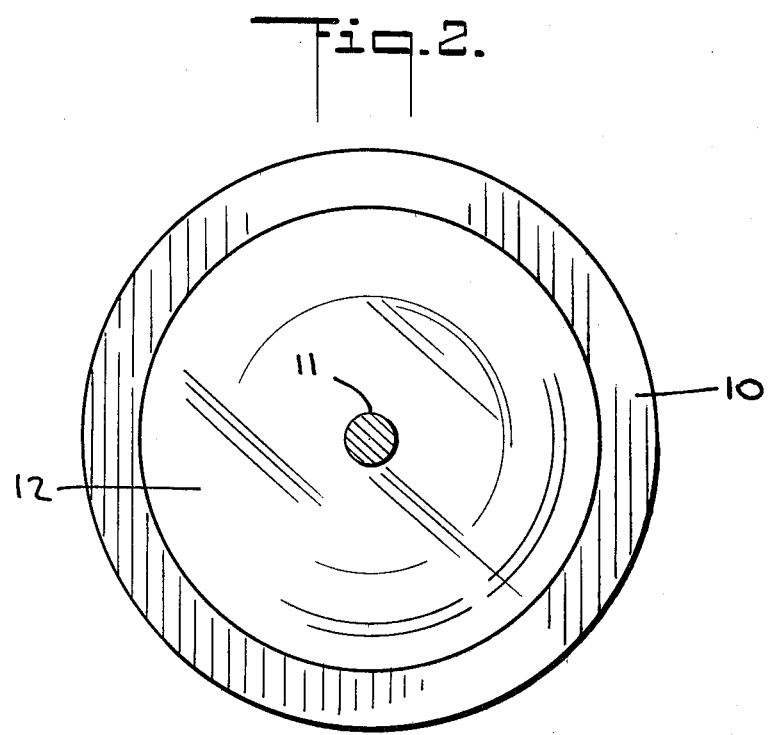

Referring now to FIGS. 1 and 2, there is shown a glass-to-metal compression sealed lead-in structure comprising an outer ring-like metal case 10, a lead-in conductor 11 coaxially disposed with respect to the case and extending through the opening thereof, and a glass seal 12 filling the annular space between the conductor and the case. The lower end 11A of conductor 11 is threaded to meet specified requirements. This threading is shown only as an example of a conductor requiring machining, for in practice, the conductor may take other forms.

Case 10 is composed of cold rolled steel having a relatively high CTE of about $120 \times 10^{-7}/°$ C. (between 30° and 300° C.). The glass seal 12 whose composition may typically be $SiO_2$-11.6; $B_2O_3$-14.9; MgO-9.1; BaO-48.0; $Al_2O_3$-8.2 and ZnO-8.2, has a CTE of about $90 \times 10^{-7}/°$C. (between 30° and 300° C.). Conductor 11 is preferably formed of substantially non-magnetic stainless steel which is readily machinable. Where it is not necessary to have a non-magnetic conductor, other steels may be used.

Many stainless steels have a high CTE and are therefore normally not acceptable for a conductor in a compression sealed structure. However, after the stainless steel conductor is machined to create threading 11A or whatever other formation is required by the specification, the machined conductor is then treated in the manner to be later described to impart thereto a low value of CTE of about $90 \times 10^{-7}/°$C. which matches that of the glass seal and therefore renders it acceptable.

In practice, the CTE of the glass seal may be higher than that of the conductor and lower than that of the case so that it has an intermediate value. The invention is not limited to compression seals which use glass and is applicable to other insulating materials such as ceramics having CTE values appropriate to compression seals.

In manufacturing this structure, the glass providing the seal is preformed into a configuration approximating the configuration of the final seal. To make the compression seal, the outer case, the preformed glass and the metallic conductor are placed in a jig at their intended positions in the lead-in structure, and the assembly is then heated above the softening point of the glass.

After the glass has wet both the metal case and the metal lead-in conductor, it is cooled to room temperature at a rate consistent with the mass of the glass seal and any annealing requirements. As the assembly cools, the steel case exerts a compressive stress upon the glass seal and the inner conductor due to the relatively high thermal contraction of the steel case during cooling. This stress maintains the mechanical integrity of the seal.

In order to impart to the stainless steel conductor the necessary low CTE value after this high CTE meterial is machined to specified requirements, it is necessary to treat the steel. I have found that I can lower the CTE of stainless steel to render it compatible with the CTE of glass by carburizing the surface thereof. Steel is essentially an alloy of iron and carbon, with or without other elements. In stainless steel, the iron is alloyed with at least 11% chromium, this acting to render the steel chemically resistant and also non-magnetic. The carbon content of steel does not usually exceed 1.7%.

Carburizing is a process of case hardening in which carbon is introduced into a solid, iron-based alloy by heating it above the transformation temperature range while in contact with a carbonaceous material. But since carburizing results in case hardening, it becomes extremely difficult to thereafter machine the stainless steel conductor, which is why the machining step must be carried out before carburizing.

In the present invention, the case hardening resulting from carburizing is an incidental effect, for I have discovered that I can lower the CTE of the steel by surface carburizing to the extent dictated by the requirements of the compression seal. Thus the degree to which the surface is carburized is not determined by case hardening requirements but only by CTE requirements.

This technique for treating the steel surface allows one to fabricate lead-in conductors which are inexpensive and commercially available in a range of forms, and are readily machinable. It makes it possible to provide an inner conductor which is substantially non-magnetic, this characteristic being desirable in many practical applications.

I have also found that like results are obtainable by substituting chromium for carbon. Thus I have electroplated chromium onto cold rolled steel and then partially diffused the chromium into the metal to lower the CTE thereof to an extent which renders it compatible with the glass seal.

Similar results may be obtainable with various other metals diffused into the base metal of the conductor, such as boron, columbium, molybdenum, silicon, titanium, tungsten and zirconium. The surface material can be applied by electroplating, vacuum metallizing, plasma, sputtering or other known techniques for ensheathing the base metal.

While there has been shown and described a preferred embodiment of a glass-to-metal compression sealed lead-in structure in accordance with the invention, it will be appreciated that many changes and modifications may be made therein without, however, departing from the essential spirit thereof. Thus while the invention has been described in the context of compression sealed lead-in structures, it is also applicable to matched sealed structures in which the CTE of the materials used must be modified to effect the desired matching of CTE's. The term "machining" as used herein is not limited to shaping or turning by machine-operated tools, but includes any working technique to form the metal to its desired form.

I claim:

1. A glass-to-metal compression sealed lead-in structure for electronic devices comprising:

A an outer metal case having a high coefficient of thermal expansion;

B a lead in conductor of predetermined form extending through the opening in the case, said conductor being formed of steel having a high coefficient of expansion which is machined to the required form of the conductor, the surface of the steel being treated after machining to impart to the conductor a relatively low coefficient of thermal expansion; and C a glass seal filling the space between the conductor and the case and having a coefficient of thermal expansion which is lower than that of the case and no lower than that of the conductor.

2. A structure as set forth in claim 1, wherein said case is formed of steel.

3. A structure as set forth in claim 1, wherein said stainless steel is non-magnetic.

4. A structure as set forth in claim 3, wherein the surface of the stainless steel is carburized to an extent imparting thereto the desired low coefficient of thermal expansion.

5. A structure as set forth in claim 3, wherein the surface of the stainless steel has chromium diffused therein to impart thereto the desired low coefficient of thermal expansion.

* * * * *